United States Patent [19]

Lau et al.

[11] Patent Number: 5,479,109
[45] Date of Patent: Dec. 26, 1995

[54] TESTING DEVICE FOR INTEGRATED CIRCUITS ON WAFER

[75] Inventors: James C. K. Lau, Torrance; Richard P. Malmgren, Castaic; Kenneth Lui, Fountain Valley, all of Calif.

[73] Assignee: TRW Inc., Redondo Beach, Calif.

[21] Appl. No.: 187,952

[22] Filed: Jan. 28, 1994

Related U.S. Application Data

[63] Continuation-in-part of Ser. No. 892,908, Jun. 3, 1992, Pat. No. 5,336,992.

[51] Int. Cl.⁶ .................................................. G01R 1/06
[52] U.S. Cl. ........................ 324/758; 324/754; 324/158.1
[58] Field of Search .................................. 324/757, 758, 324/750, 763, 762, 763, 754; 348/87; 356/401; 439/482

[56] References Cited

U.S. PATENT DOCUMENTS

| | | | |
|---|---|---|---|
| 3,963,985 | 6/1976 | Gelderman | 324/754 |
| 4,471,298 | 9/1984 | Frohlich | 324/73 PC |
| 4,574,235 | 3/1986 | Kelly et al. | 324/158 |
| 4,636,722 | 1/1987 | Ardezzone | 324/158 |
| 4,707,657 | 11/1987 | Petersen | 324/158 |
| 4,746,855 | 5/1988 | Wrinn | 324/73 R |
| 4,755,747 | 7/1988 | Sato | 324/758 |
| 4,755,750 | 7/1988 | Leurchner | 324/758 |
| 4,820,975 | 4/1989 | Diggle | 324/758 |
| 4,912,399 | 3/1990 | Greub et al. | 324/158 |
| 4,922,192 | 5/1990 | Gross et al. | 324/158 |
| 4,968,931 | 11/1990 | Littlebury et al. | 324/158 |
| 4,994,735 | 2/1991 | Leedy | 324/158 |
| 5,012,187 | 4/1991 | Littlebury | 324/158 |
| 5,055,780 | 10/1991 | Takagi et al. | 324/158 |
| 5,124,639 | 6/1992 | Carlin et al. | 324/760 |
| 5,134,365 | 7/1992 | Okubo et al. | 324/758 |
| 5,177,438 | 1/1993 | Littlebury et al. | 324/158 |
| 5,177,439 | 1/1993 | Liu et al. | 324/158 |
| 5,219,765 | 1/1993 | Yoshida et al. | 437/8 |
| 5,239,260 | 8/1993 | Widder et al. | 324/758 |
| 5,321,351 | 6/1994 | Swart et al. | 324/758 |

Primary Examiner—Vinh P. Nguyen

[57] ABSTRACT

An electrical testing device is provided for testing integrated circuits located on a wafer. The testing device employs a multi-layer test circuit having a plurality of contacts for contacting the integrated circuits on a wafer. The layers of the test circuit are embedded in a flexible transparent dielectric material which allows vertical flexing of the contacts and visual transparency through the circuit. Alignment markers are provided on the circuit and wafer and one or more viewing tubes may be used to allow a user to view the alignment markers so as to bring the circuit into proper alignment with the wafer. A microscope may further be employed with each viewing tube to provide accurate alignment examination. A stretching fixture is mounted on the circuit which enables a user to stretch the circuit to achieve a larger size when necessary.

14 Claims, 4 Drawing Sheets

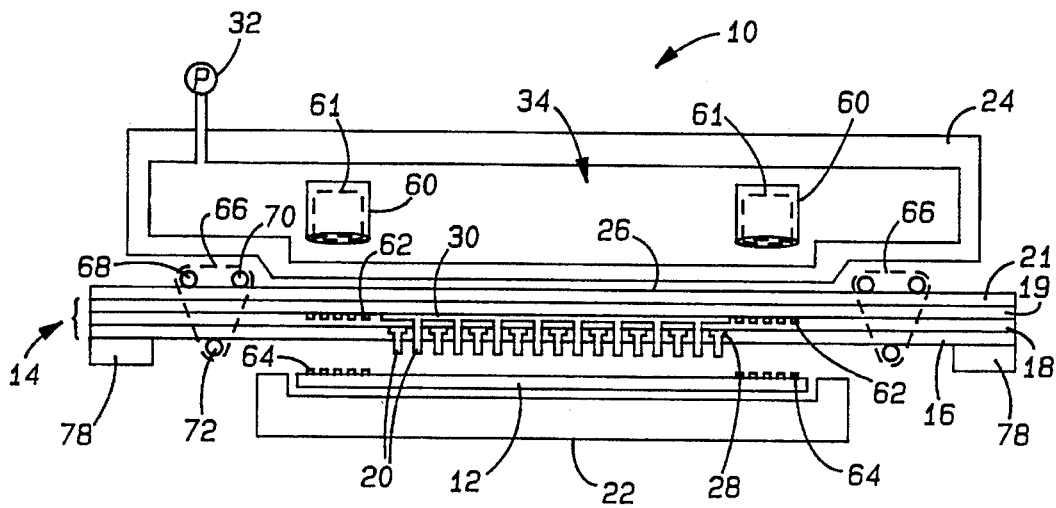
Fig-1
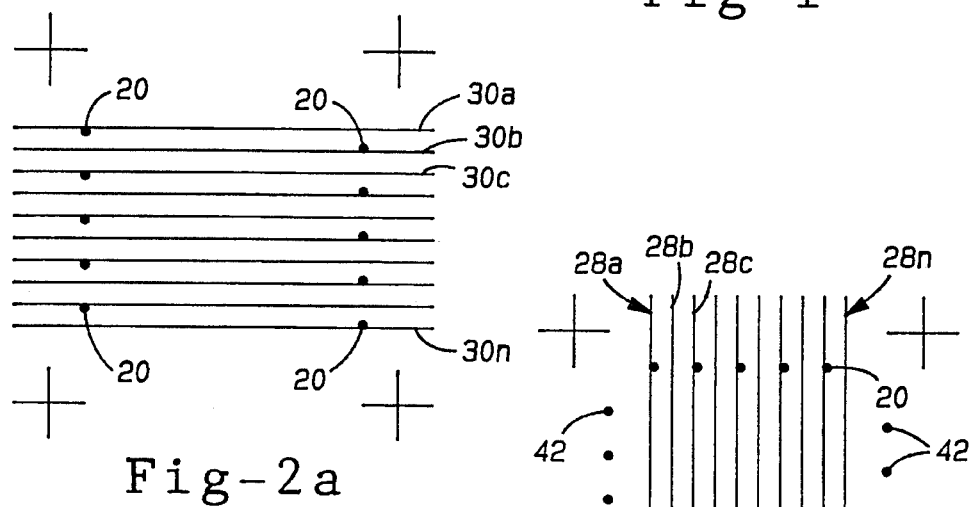
Fig-2a
Fig-2b
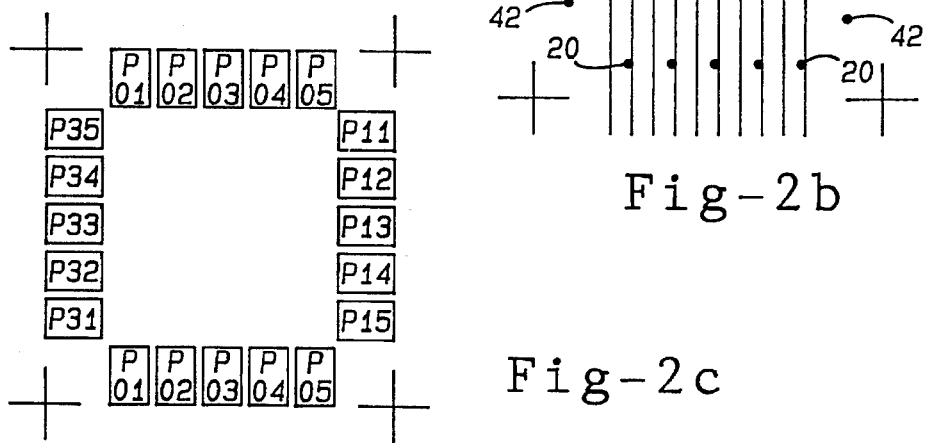
Fig-2c

TESTING DEVICE FOR INTEGRATED CIRCUITS ON WAFER

CROSS-REFERENCE TO RELATED APPLICATIONS

This is a continuation-in-part of U.S. patent application Ser. No. 07/892,908, filed on Jun. 3, 1992, entitled "On-Wafer Integrated Circuit Electrical Testing" (now U.S. Pat. No. 5,336,992), and which reference is incorporated herein.

BACKGROUND OF THE INVENTION

1. Technical Field

This invention relates to wafers having integrated circuits and, more particularly, to an electrical testing device for testing the integrated circuits located on a wafer before dicing.

2. Discussion

Current silicon wafers generally contain hundreds of integrated circuits fabricated on a single slice of silicon crystal known as a wafer. Each integrated circuit, chip, or die generally contains from tens to hundreds of thousands and possibly millions of electrical components such as inverters and gates which are interconnected to form electrical circuits. Due to increased density and wafer sizes from advanced technology, wafers are continually being developed which provide for more integrated circuits.

Generally, the individual integrated circuits on a wafer are electrically tested to determine whether the circuits or dies function properly and are therefore good. Electrical testing techniques have been provided for testing integrated circuits that have already been diced and therefore separated from the wafer. However, on-wafer electrical testing for integrated circuits before dicing can greatly improve productivity and yield. This is because handling can be reduced due to greatly reduced part count and defective parts can be identified earlier.

Known testing procedures for testing wafers prior to dicing include employing an array of test probes for mechanically stepped on-wafer electrical testing, such as that provided by an automatic probing station. This technique essentially tests one die or integrated circuit at a time and then moves to another die on the wafer and so on. However, this mechanical stepping technique involves undesirable mechanical movement.

To eliminate the undesirable mechanical movement, a device could be provided which has a sufficient amount of testing probes to test the entire wafer. However, due to the large number of necessary test fixture connections, it is practically impossible to deploy such a one-to-one testing scheme. The large number of connections required would result in a highly complex testing system.

In addition, current testing schemes generally do not provide for testing circuits having contact points close enough to fully meet the requirements of current and future high density wafers. Current testing methods include a technique employing a "bed of nails" approach. The bed of nails approach generally includes a plurality of wires for contacting the wafer. However, the wires have a limited operation distance, are generally easily susceptible to damage and often difficult to align with targeted contact points.

Furthermore, conventional testing approaches generally require some kind of technique for aligning the test circuit with the integrated circuitry to be tested on the wafer. Traditionally, this has been accomplished by visually aligning the wafer with the housing surrounding the test circuit to achieve a predetermined match. However, some of the contacts on the circuit may not properly contact the integrated circuit on the wafer due to misalignment or sometimes due to contraction or expansion of the test circuit. Using conventional approaches, it is necessary that the test circuit contacts match the exact arrangement of the integrated circuitry to within an acceptable tolerance.

It is therefore desirable to provide an on-wafer electrical testing device which has a flexible test circuit that may be accurately aligned with the contact points to be tested on a wafer. It is also desirable to provide a compliant testing circuit that may be easily aligned and also adjusted to accomodate mismatches between the contacts and contact points. It is further desirable to provide a uniform contact between the testing device and the wafer while ensuring dimensional stability thereof.

SUMMARY OF THE INVENTION

In accordance with the teachings of the present invention, an electrical testing device is provided for testing integrated circuits on a wafer. The device employs a multilayer test circuit having a plurality of contacts for contacting a wafer to be tested. The circuit is embedded in a flexible transparent dielectric material. Visual markers are provided for visually aligning the contacts with contact points connected to the integrated circuit on the wafer. A user may visually examine alignment by viewing the alignment markers through one or more viewing tubes. An actuator forcibly causes the contacts to contact the contact points on the wafer. In addition, a stretching fixture may be attached to the circuit for stretching the circuit to compensate for contact misalignment as necessary.

BRIEF DESCRIPTION OF THE DRAWINGS

The various advantages of the present invention will become apparent to those skilled in the art by reading the following specification and by reference to the following drawings in which:

FIG. 1 is an elevational side view of an on-wafer integrated circuit electrical testing device in accordance with the present invention;

FIGS. 2A through 2C illustrate contact alignment of the testing device with a wafer; FIG. 2A is a top view of an upper contact layer of a testing circuit, FIG. 2B is a top view of a lower contact layer of the testing circuit, and FIG. 2C is a top view of contact locations on a wafer to be tested;

FIG. 3A illustrates a top alignment marker, FIG. 3B illustrates a bottom alignment marker, and FIG. 3C illustrates the visual alignment of top and bottom markers as seen through a video tube;

DETAILED DESCRIPTION OF THE PREFERRED EMBODIMENTS

Figure 3A:
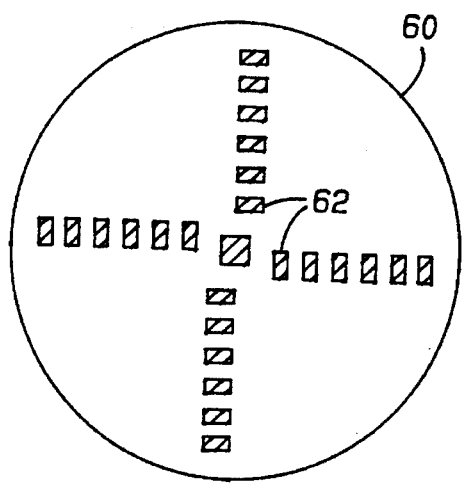
FIGS. 3A through 3C are top views of alignment markers which illustrate visual alignment of the circuit to the wafer.
Figure 3B:
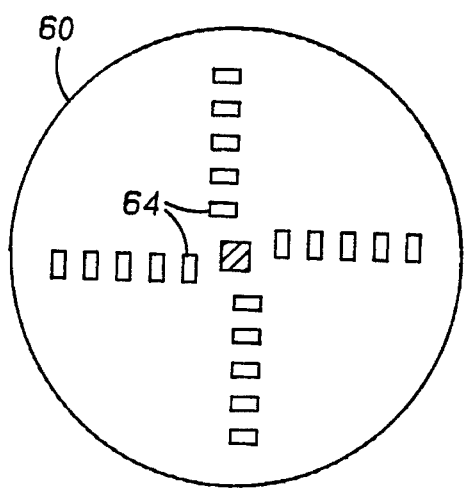
Figure 3C:
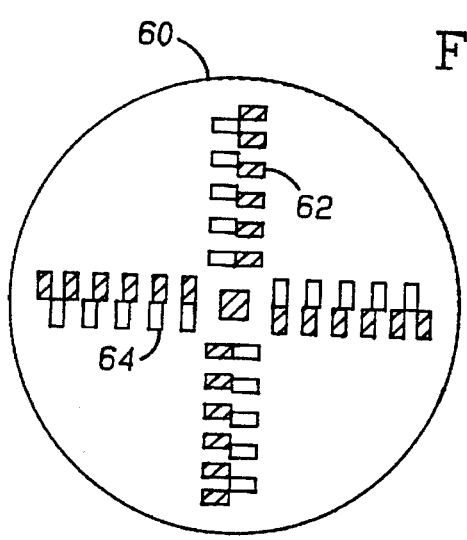

Turning now to FIG. 1, an on-wafer integrated circuit electrical testing device 10 is shown therein for testing integrated circuits on a semiconductor wafer 12. Testing device 10 includes a multilayer thin film test circuit 14 which has a plurality of testing contact bumps 20 for contacting the integrated circuits located on the wafer 12.

The test circuit 14 includes first, second and third successive layers 16, 18 and 19 which are located one on top of the other. A top view of the bottom two layers 18 and 16 is shown in FIGS. 2A and 2B, respectively. The first or bottom layer 16 of test circuit 14 includes a plurality of conductive circuit traces or bars 28 positioned in a substantially parallel arrangement. The plurality of conductive bars 28 are embedded in a flexible transparent dielectric support material which provides isolation between the conductive bars 28 and adjacent layers. Each of the plurality of conductive bars 28 includes a plurality of contacts 20 extending vertically downward from each conductive bar 28.

The second layer 18 is located on top of the bottom layer 16 and has a similar circuit configuration. The second layer 18 of the test circuit 14 includes a second plurality of conductive circuit traces or bars 30 similarly located in a substantially parallel arrangement which are also embedded in a flexible transparent dielectric support material. Each of the second plurality of conductive bars 30 likewise includes a plurality of contacts 20 extending vertically downward therefrom. Each of the contacts 20 include a conductive via 23 which has a contact bump located on the end thereof for contacting the integrated circuitry on the wafer 12 to be tested.

The third or top layer 19 of the test circuit 14 includes a layer of flexible transparent dielectric support material which further provides isolation of the circuit. This invention utilizes a circuit 14 that is configured within the flexible and transparent dielectric support material. The preferred embodiment shown includes three layers; however, more or less layers could be employed without departing from the inventive concept described herein. For instance, second layer 18 may be configured with a larger thickness in a manner which adequately covers conductive traces 30 so as to eliminate the need for top layer 19.

The flexible transparent dielectric material provided in the three layers 16, 18 and 19 of the test circuit 14 is resilient and flexible enough to allow localized vertical movement. Yet the dielectric material is also somewhat supportive so as to maintain the circuit configuration. As such, the dielectric material allows the conductive bars 28 and 30 and the contacts 20 associated therewith to flex vertically, thereby allowing for a snug contact between each of contacts 20 and the wafer 12 to be tested. In addition, the flexible dielectric material is transparent enough to allow a user to visibly align the circuit 19 with a wafer 12 to be tested. This flexible transparent dielectric material preferably includes transparent benzocyclobutene (BCB) which is commercially available from Dow Chemical Corp. or transparent polyimide which is commercially available from E.I. dupont de Nemours & Co, Inc. However, other comparable flexible and transparent dielectric materials may be employed in place thereof or in addition thereto. For instance, fiber reinforced materials such as glass or KEVLAR® may be added to benzocyclobutene to further reinforce the dielectric material. Also, polyester may be employed to reduce the cost but may be limited to a narrower temperature range of operation.

The test circuit 14 is fabricated with precise layer to layer alignment. Test circuit 14 may be fabricated by photolithographic techniques known in the art which are capable of providing a spacing as close as one mil or less between the adjacent contacts 20. The close spacing between the contacts 20 thereby allows for testing of very dense wafer circuitry. The contacts 20 are made up of a conductive material such as copper or any other suitable conductive material. In addition, the finishing metallization for the contacts 20 are preferably optimized to acheive minimum contact resistance and avoid cold welding, and are formed by vacuum deposition and lift-off.

The testing device 10 further employs an air chamber 34 which is located above the test circuit 14. The air chamber 34 receives pressurized air through pressure switch 32 from an external pressurized air source (not shown). The bottom surface of the air chamber 34 includes an expandable transparent bottom surface 26 which may be made of a thin layer of TEFLON® amorphous fluoropolymer (AF), polyimide or other transparent materials. The thin bottom surface 26 provides an air tight seal for air chamber 34, yet flexes and expands when exposed to sufficient pressure differential. When the air pressure in the air chamber 34 is increased, the bottom surface 26 flexes outward as the air chamber 34 expands to actuate the circuit 14.

The bottom surface 26 preferably contacts a transparent support layer 21 which is located on top of the circuit 14. The support layer 21 is made of a dimensionally stable transparent material which may include a resin material such as TEFLON® AF or polyimide. Alternately, glass or other transparent fiber reinforced materials such as KEVLAR® may be used in support layer 21. TEFLON® and KEVLAR® are both commercially available from E.I. dupont de Nemours & Co., Inc. In order to maintain transparency, one may find it advantageous to arrange the fiber distribution in the transparent dielectric material which makes up circuit 14 and support layer 21 so as to achieve adequate visual transparency therethrough. The support layer 21 may be selected with a coefficient of thermal expansion (CTE) substantially matching the CTE of the wafer 12. The support layer 21 essentially provides dimensional support to the test circuit 14. As a result of this expansion, the bottom surface 26 of air chamber 34 applies uniform pressure to the test circuit 14, which in turn causes the contacts 20 of test circuit 14 to contact the integrated circuits on the wafer 12.

A support ring 78 is further connected to the bottom side of test circuit 14. Support ring 78 is preferably made of aluminum and extends about the outer portions of circuit 14. Ring 78 further stabilizes test circuit 14 and allows a user to handle circuit 14 for purposes of moving the circuit 14.

A base plate 22 is further provided on the bottom of the testing device 10 for maintaining each wafer 12 to be tested in a static position while undergoing the desired alignment and testing operations. The base plate 22 in conjunction with the support layer 21 provide dimensional stability to the test circuit 14 and wafer 12.

FIGS. 2A through 2C illustrate the alignment of the bottom two layers 16 and 18 of the test circuit 14 with the contact locations on one die 50 formed in the wafer 12. FIG. 2A shows the upper layer 18 of the test circuit 14 which includes the plurality of conductive traces or bars 30A through 30N. Each of the plurality of conductive bars 30A through 30N are connected to the corresponding plurality of contacts 20 associated therewith. Each of the contacts 20 extend from the corresponding conductive bar downward through an opening in the bottom layer 16 to the contact location on the die 50 of the wafer 12 to be tested. Each of the plurality of conductive bars 30 are dielectrically isolated from one another via the dielectric material.

FIG. 2B illustrates the bottom layer 16 of the test circuit 14. The bottom layer 16, likewise, includes a plurality of conductive traces or bars 28A through 28N. Each of the conductive bars 28A through 28N similarly are connected to the corresponding plurality of contacts 20 associated therewith. Each of the contacts 20 extend downward from the corresponding conductive bar 28 and are adapted to contact the die on the wafer 12 to be tested. The bottom layer 16 further includes a plurality of through-holes or openings (42) through which the contacts 20 from the upper layer 18 are allowed to extend therethrough.

FIG. 2C illustrates one example of contact locations P01 through P05, P11 through P15, P21 through P25, and P31 through P35 on a die 50 that is formed in wafer 12 to be tested. Each of the contact locations represents the contact points on the die 50. The contacts 20 from the upper and lower layers 16 and 18 of the test circuit 14 are adapted to come into contact with the contact points to enable testing of the die 50 on the wafer 12.

Referring back to FIG. 1, the testing device 10 further includes a pair of viewing tubes 60 mounted inside the air chamber 34. Viewing tubes 60 may include microscopes 61 arranged therein and which are operatively focused toward the wafer 12. A set of top alignment markers 62 are located below each microscope 60 within one layer of circuit 14 such as circuit layer 18. A set of bottom alignment markers 64 are provided on the top surface of wafer 12. Together, the alignment of top and bottom markers 62 and 64 indicates proper alignment of contacts 20 to the contact points on the wafer 12.

A user may visually view the alignment of markers 62 and 64 through the viewing tubes 60 without microscopes 61. However, the addition of magnified microscopes 61 may provide a more accurate alignment indication. While two viewing tubes 60 and associated microscopes 61 are described herein, it should be appreciated that one or more viewing tubes and microscopes may suffice. However, a larger number of viewing tubes 60 will more adequately serve to provide precise alignment measurement.

Figure 4:
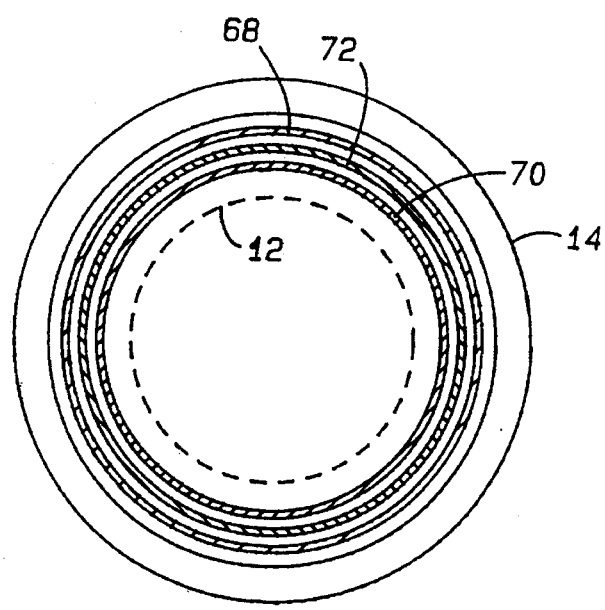
FIG. 4 is a top view of the testing device which illustrates a circuit stretching fixture.

The testing device 10 further includes a circuit stretching fixture 66 located near the outer periphery of test circuit 14 and support layer 21 as shown in FIGS. 1 and 4. The circuit stretching fixture 66 includes a pair of top pressure rings 68 and 70 which are in contact with the top surface of support layer 21 and a bottom pressure ring 72 which contacts the bottom surface of test circuit 14. Bottom pressure ring 72 has a diameter somewhere in between the diameters of top pressure rings 68 and 70.

The circuit stretching fixture 66 operates so as to forcibly squeeze together the top and bottom of test circuit 14 to compress and thereby stretch the circuit 14 to a desired size. This is accomplished by applying force to bottom pressure ring 672 so as to cause ring 72 to move toward top pressure rings 68 and 70. Bottom pressure ring 72 may be segmented and therefore provided as a plurality of pressure bars which enables one to achieve regional stretching to compensate for distortion of circuit 14.

The stretching fixture 66 along with video tubes 60 and microscopes 61 may advantageously be employed together to provide for the proper alignment of circuit 14 with wafer 12. That is, microscope 60 may be monitored to determine any necessary expansion of circuit 14. Next, the circuit stretching fixture 66 may be compressed so as to cause the size of the contact surface area of circuit 14 to expand. Since stretching fixture 66 provides circuit enlargement, one may find it advantageous to employ a test circuit 14 that is slightly smaller than the wafer 12 being tested. Accordingly, the circuit 14 can then be stretched during alignment to achieve the proper dimensions.

Figure 5:
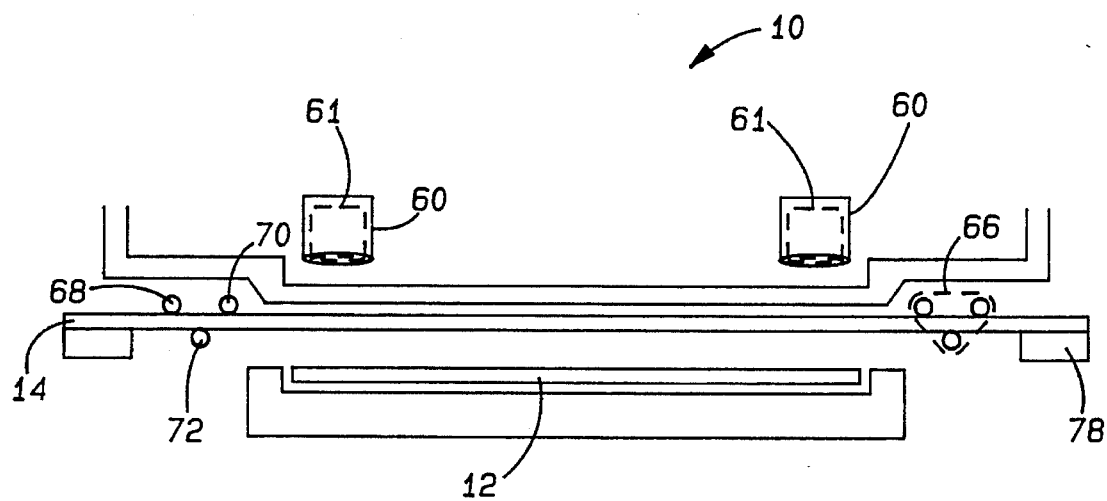
FIG. 5 is a diagrammatic view of the testing device without a support layer in accordance with an alternate embodiment of the present invention.

According to an alternate embodiment of the present invention, one may employ the circuit stretching fixture 66 without the support layer 21 as shown in FIG. 5. Removal of support layer 21 provides for enhanced ability to compress the circuit 14. This provides for larger size deviations in circuit 14 without requiring as much energy to operate circuit stretching fixture 66.

Figure 6:
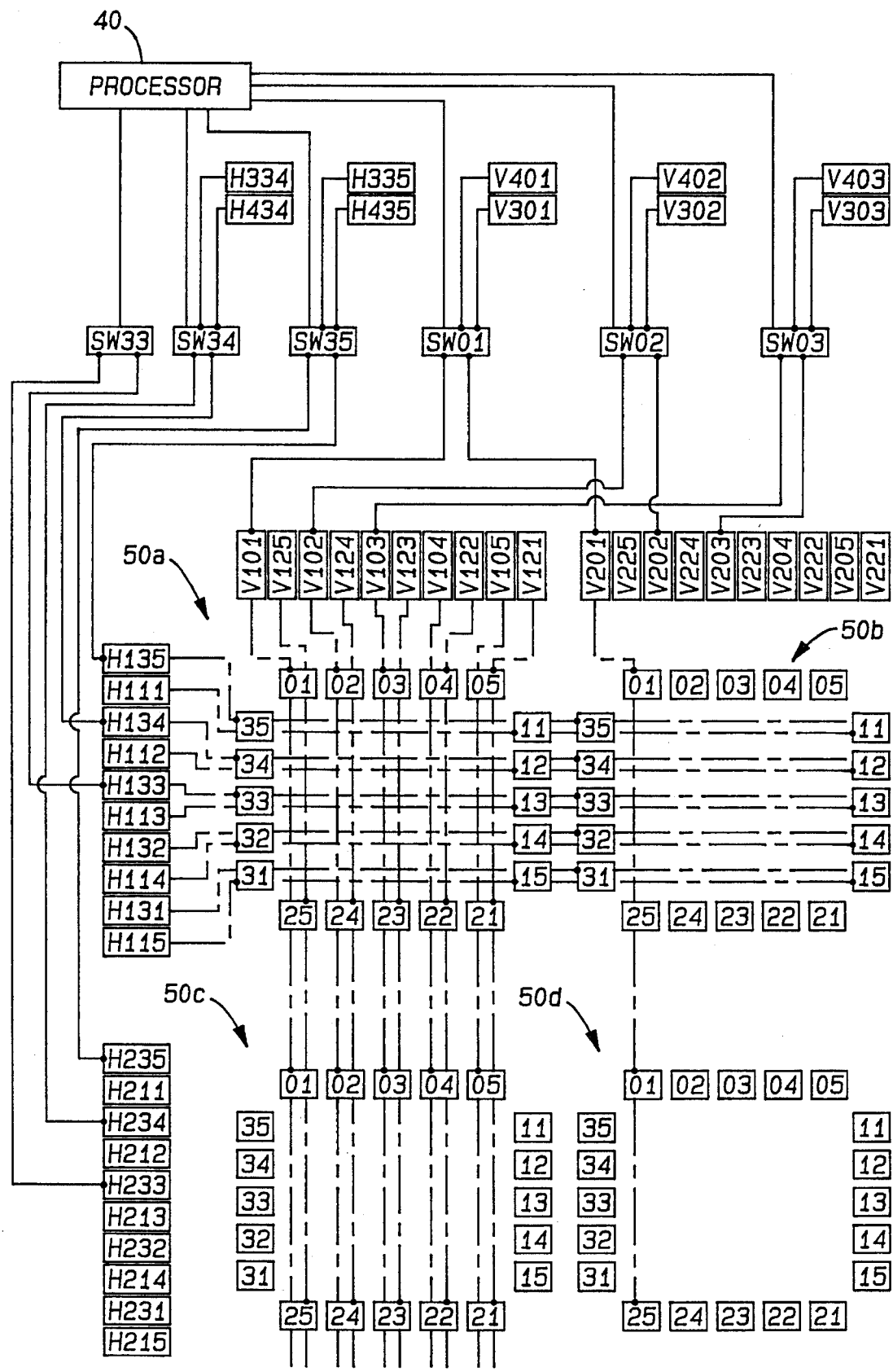
FIG. 6 is a detailed drawing of the contact testing points on the circuit for the on-wafer integrated circuit electrical testing device.

FIG. 6 illustrates the contact testing points on the circuit 14 and the switching associated with the testing of the plurality of dies 50a through 50d on a wafer 12. The testing device 10 is preferably set up to test one of the dies 50a through 50d, one at a time. In the preferred embodiment, the testing device 10 employs a plurality of switches which allows the device 10 to select which die is to be tested. The switches SW01, SW02, and SW03 control the vertical column switching. Similarly, the switches SW35, SW34 and SW33 control the horizontal row switching.

A microprocessor 40 is further provided. The microprocessor 40 is a standard off-the-shelf programmable microprocessor having programming capabilities. Microprocessor 40 controls the switching sequence and further receives and analyzes the test signals to determine whether each die operates properly. Switch SW01 shown on the vertical column is adapted to select one of the vertical test signals V101, V201, ... VN01. Switch SW02, likewise, is adapted to select one of the test signals V102, V202, ... , VN02. Likewise, the horizontal rows are configured to operate in the same manner. Switch SW35 is adapted to select one of the horizontal test signals H135, H235, ... , HN35 and so on. In this manner, the device 10 is able to select the appropriate die 50 to test without requiring additional mechanical movement.

The switching described herein is provided so that the need to move the test probes from die to die can be eliminated. The use of the switching alone, however, is provided at a cost of being unable to test some combination of contact points. In order to assure that all contact point combinations are testable, the device 10 may employ relative movement of the test circuit 14 and the wafer 12 in accordance with an alternate embodiment of the present invention. The advantage of being able to test points on a wafer separated by one mil is retained. The relative movement of the test circuit 14 on the wafer 12 under testing conditions can be limited to movement from row to row only. This could be accomplished in a pattern simpler than the mechanical probe where both movement from row to row and from column to column are generally required.

Figure 7:
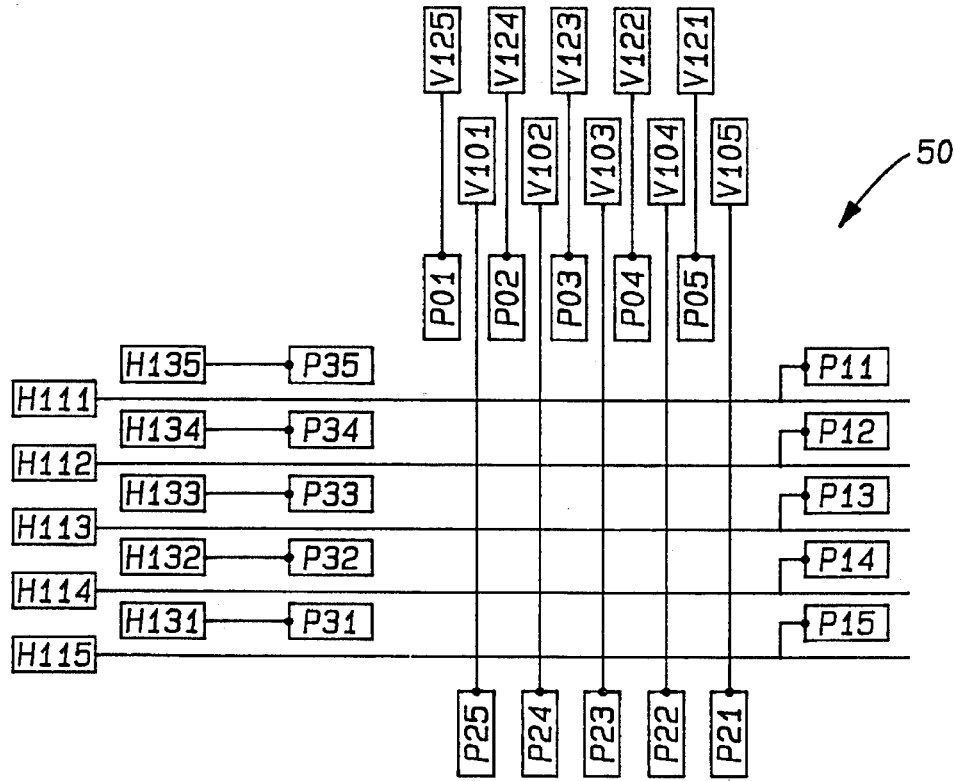
FIG. 7 is a partial view of FIG. 6 which illustrates the contact testing points associated with a single die on a wafer.

Turning now to FIG. 7, shown therein is the testing configuration for one individual die 50 of the wafer 12. The testing scheme for this single die 50 is a ten-by-ten array which includes ten vertical input signals V101 through V105 and V121 through V125 and ten horizontal output signals H111 through H115 and H131 through H135. The Testing signals are applied to the twenty test points shown therein which include vertical test points P01 through P05 and P21 through P25 and horizontal test points P11 through P15 and P31 through P35.

In operation, a wafer 12 to be tested is inserted onto bottom support structure 22 of the testing device 10. A user visually aligns the test circuit 14 with the wafer 12 by viewing the alignment markers 62 and 64 through viewing tubes 60, preferably with the aid of microscopes 61. If misalignment is detected, a user may reposition the wafer 12 and/or may adjust the size of test circuit 14 by selectively compressing circuit 14 via the circuit stretching fixture 66.

Once the alignment is suitable for testing, a selected amount of pressure is applied to the air chamber 34. This in turn causes the bottom surface 26 to contact the support layer 21 in the preferred embodiment which in turn moves circuit 14 toward the wafer 12. The contacts 20 of circuit 14 are then forcibly brought into contact with the integrated circuitry on the wafer 12.

Once in position, the microprocessor 40 is ready to begin electrical testing of the circuitry. In doing so. Vertical test signal V101 is applied to contact point P01. The microprocessor 40 then receives an output signal from the desired horizontal contact point as chosen. The microprocessor 40 then determines whether or not the measured output signals indicates proper operation of the die 50. Similarly, vertical test signal V102 is applied to contact point P02. The microprocessor 40 receives an output signal from the desired horizontal contact point as chosen. The remaining signals are applied to the remaining contact points and the die 50 is tested in a likewise manner.

In view of the foregoing, it can be appreciated that the present invention enables the user to achieve a more simplified and effective testing device for testing the integrated circuits on a wafer. Thus, while this invention has been disclosed herein in connection with a particular example thereof, no limitation is intended thereby except as defined by the following claims. This is because the skilled practitioner will recognize that other modifications can be made without departing from the spirit of this invention after studying the specification and drawings.

What is claimed is:

1. An electrical testing device for testing integrated circuits on a wafer, said device comprising: circuit means including a multilayer test circuit fabricated in a flexible dielectric material and having a plurality of conductive contacts extending from a contact surface thereof for contacting contact points connected to circuitry on the wafer to be tested;

stretching means for selectively stretching said circuit means so as to expand the contact surface of the test circuit to compensate for misalignment between the conductive contacts and contact points;

actuation means for forcibly causing the conductive contacts to contact the contact points on the wafer;

a first set of alignment markers located within said multilayer test circuit, said first set of alignment markers being operable for aligning with a second set of alignment markers located on a top surface of said wafer; and viewing means for allowing visual viewing through the dielectric material of the test circuit and the first and second sets of alignment markers so that the first set of alignment markers may be aligned with the second set of alignment markers to achieve alignment of the conductive contacts with the contact points on the wafer.

2. The device as defined in claim 1 wherein said stretching means comprises first and second spaced rings located on one side of the circuit means and a third ring located on the other side, wherein said third ring is forcibly moved toward the first and second rings so as to compress the dielectric material therebetween thereby causing the circuit to expand.

3. The device as defined in claim 1 further comprising a dimensionally stable and transparent support material located on top of the circuit means.

4. The device as defined in claim 1 wherein said viewing means comprises at least one viewing tube.

5. The device as defined in claim 1 wherein said viewing means comprises at least one microscope.

6. The device as defined in claim 1 wherein said dielectric material comprises a transparent material.

7. An electrical testing device for testing integrated circuits on a wafer, said device comprising:

circuit means including a multilayer test circuit fabricated in a flexible and transparent dielectric material and having a plurality of conductive contacts extending from a contact surface for contacting contact points connected to circuitry on the wafer;

actuation means for forcibly causing the conductive contacts to come into contact with the contact points on the wafer;

alignment means for visually aligning the circuit means with the wafer so that the conductive contacts are aligned with the integrated circuit on the wafer; and stretching means for selectively stretching the circuit means so as to expand the contact surface of the test circuit to compensate for misalignment of the conductive contacts and contact points.

8. The device as defined in claim 7 wherein said stretching means comprises first and second spaced rings located on one side of the circuit means and a third ring located on the other side, wherein said third ring is forcibly moved toward the first and second rings so as to compress the dielectric material therebetween thereby causing the circuit to expand to a desired shape.

9. The device as defined in claim 7 wherein said alignment means comprises one or more viewing tubes.

10. The device as defined in claim 7 wherein said alignment means comprises one or more microscopes.

11. The device as defined in claim 7 wherein said alignment means further includes a first set of alignment markers located within the multilayer test circuit, said first set of alignment markers being operable for aligning with a second set of alignment markers located on a top surface of the wafer, wherein a user may visually look through the transparent material of the test circuit and align the first set of alignment markers with the second set of alignment markers to bring the conductive contacts into alignment with the contact points on the wafer.

12. An electrical testing device for testing integrated circuits on a wafer, said device comprising:

circuit means including a thin multilayer test circuit fabricated in a flexible and transparent dielectric material and having a plurality of conductive contacts extending from a contact surface for contacting contact points connected to circuitry on the wafer to be tested;

actuation means for forcibly causing the conductive contacts to contact the contact points on the wafer;

a first set of alignment markers located within the multilayer test circuit;

a second set of alignment markers located on the wafer;

viewing means for allowing visually viewing through the transparent dielectric material of the test circuit and the first and second sets of alignment markers so that the first set of alignment markers may be aligned with the second set of alignment markers so as to bring the conductive contacts into alignment with the contact points on the wafer; and stretching means including a plurality of compressible rings for stretching the circuit means when necessary to enlarge the contact surface of the test circuit so as to compensate for misalignment between the conductive contacts and contact points.

13. A method of testing electrical integrated circuits on a wafer comprising:

loading a wafer to be tested onto a base support structure;

forcibly actuating a test circuit which is embedded in a flexible and transparent dielectric material and which has a plurality of conductive contacts extending from a contact surface so as to bring the conductive contacts into contact with contact points connected to integrated circuitry on the wafer;

visually aligning the conductive contacts with the integrated circuitry on the wafer by looking through the transparent dielectric material of the test circuit and viewing alignment markers through at least one viewing region looking through the circuit;

stretching the test circuit and the dielectric material when necessary to expand the contact surface of the test circuit so that the contacts match the arrangement of contact points on the wafer; and testing said integrated circuits by applying and receiving signals via selected ones of the contacts.

14. The method as defined in claim 13 wherein said step of visually aligning includes viewing said alignment markers through a microscope located in each viewing region.

* * * * *